United States Patent
Hatano

(10) Patent No.: US 12,090,624 B2
(45) Date of Patent: Sep. 17, 2024

(54) SAMPLE STAND AND METHOD FOR MANUFACTURING SAMPLE STAND

(71) Applicant: KIOXIA CORPORATION, Tokyo (JP)

(72) Inventor: Kazuya Hatano, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 389 days.

(21) Appl. No.: 17/680,118

(22) Filed: Feb. 24, 2022

(65) Prior Publication Data

US 2023/0090602 A1 Mar. 23, 2023

(30) Foreign Application Priority Data

Sep. 21, 2021 (JP) ................................. 2021-153211

(51) Int. Cl.
*B25H 1/00* (2006.01)
*H01J 37/20* (2006.01)

(52) U.S. Cl.
CPC ............ *B25H 1/0042* (2013.01); *H01J 37/20* (2013.01)

(58) Field of Classification Search
CPC  B25H 1/0042; H01J 37/20; H01J 2237/2802; H01J 2237/31732; H01J 2237/31745
See application file for complete search history.

(56) References Cited

U.S. PATENT DOCUMENTS

| | | | | | |
|---|---|---|---|---|---|
| 5,367,171 | A | * | 11/1994 | Aoyama | H01J 37/20 250/442.11 |
| 7,394,075 | B1 | * | 7/2008 | Wang | G01N 1/32 250/311 |
| 2006/0113478 | A1 | * | 6/2006 | Moore | H01J 37/26 250/311 |
| 2006/0219919 | A1 | * | 10/2006 | Moore | H01J 37/26 250/311 |

(Continued)

FOREIGN PATENT DOCUMENTS

| JP | H11-329325 A | 11/1999 |
|---|---|---|
| JP | 2005-283456 A | 10/2005 |

(Continued)

OTHER PUBLICATIONS

"Omniprobe/FIB Lift-Out TEM Grid" EMJapan Co., Ltd., with English Translation, downloaded Nov. 24, 2021, 17 pages. URL: https://www.em-japan.com/grid2.html.

(Continued)

*Primary Examiner* — David A Vanore
(74) *Attorney, Agent, or Firm* — Kim & Stewart LLP

(57) ABSTRACT

A sample stand includes a base portion that is made of a first material and has an arcuate outer edge in a plane having a first direction and a second direction orthogonal to the first direction, a first portion that is provided on an upper portion of the base portion in the second direction and in which a second material is embedded, a second portion that is provided on the upper portion of the base portion in the (Continued)

second direction and in which a third material is embedded, and a sample holding portion on which a sample is to be held. The sample holding portion is provided on the upper portion of the base portion in the second direction, between the first portion and the second portion in a third direction orthogonal to each of the first direction and the second direction.

20 Claims, 13 Drawing Sheets

(56) References Cited

U.S. PATENT DOCUMENTS

2015/0235805 A1* 8/2015 Gardiner ............... G01L 19/04
374/161

2023/0090602 A1* 3/2023 Hatano ............... B25H 1/0042
269/289 R

FOREIGN PATENT DOCUMENTS

| JP | 2006-172958 A | 6/2006 |
| JP | 4654018 B2 | 3/2011 |

OTHER PUBLICATIONS

"Grid/notch mesh for FIB (focused ion beam device)" Oken Shoji Co., Ltd., with English Translation, downloaded Nov. 24, 2021, 35 pages. URL:http://www.okenshoji.co.jp/fib-grid.html.

"Nanomesh" Hitachi High-Tech Fielding Corporation, 1995, 2021, with English Translation, 5 pages. URL: https://www.hitachi-hightech.com/hhs/support/service/maintenance/fib/consumables.html.

* cited by examiner

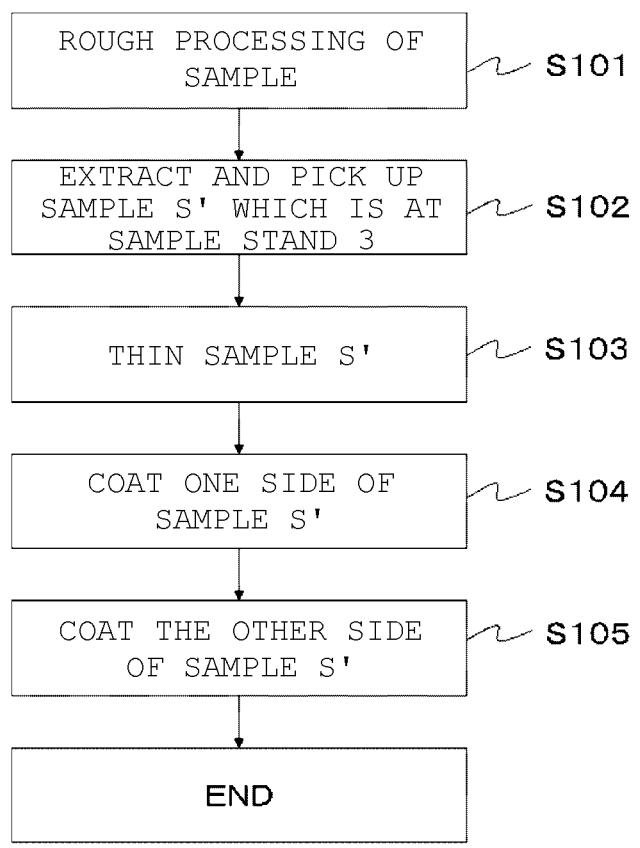

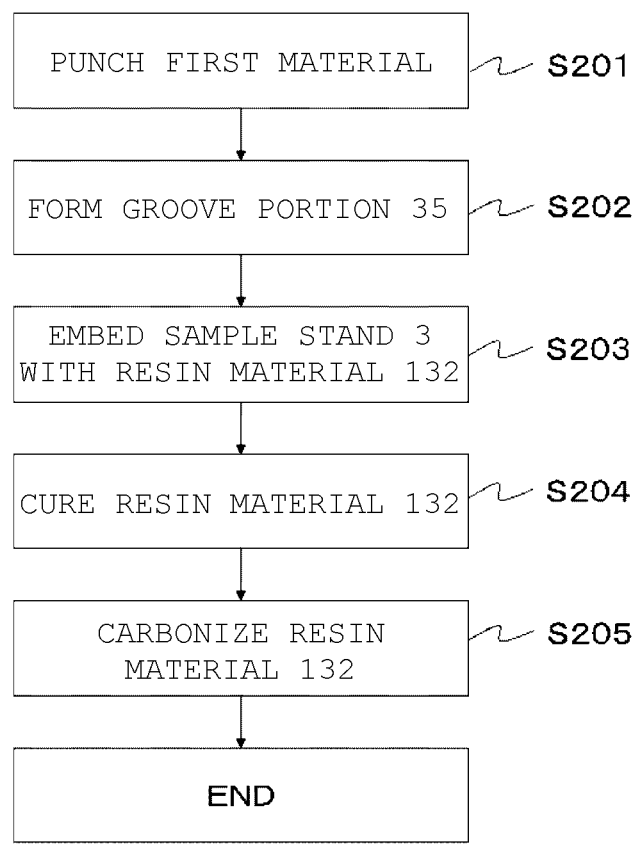

FIG. 9A
FIG. 9B
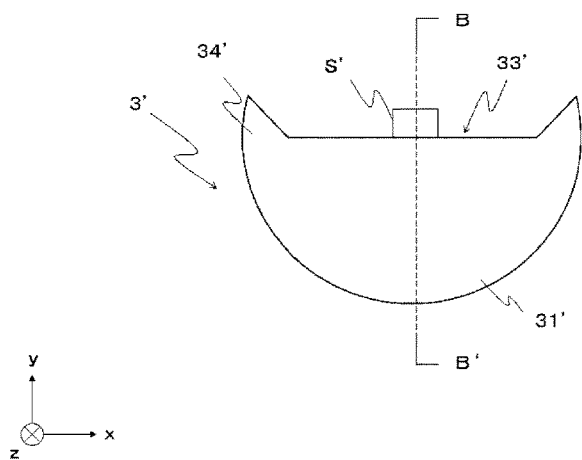
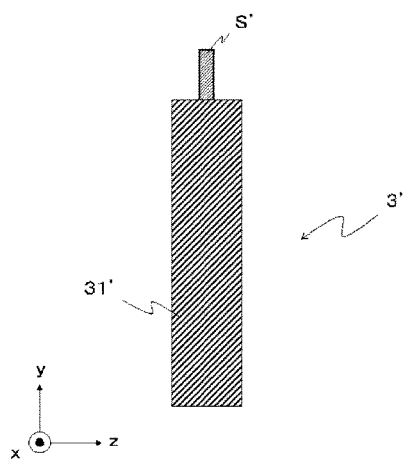
FIG. 9C
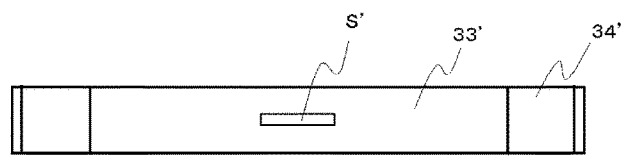
FIG. 10
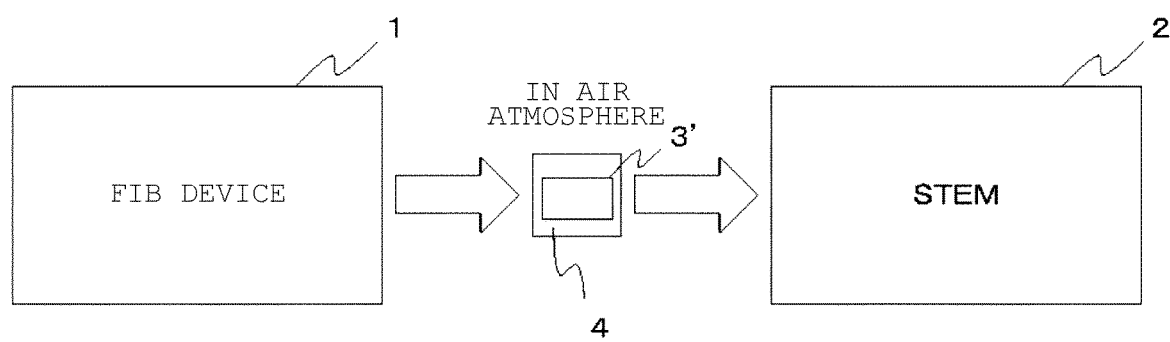

SAMPLE STAND AND METHOD FOR MANUFACTURING SAMPLE STAND

CROSS-REFERENCE TO RELATED APPLICATION (S)

This application is based upon and claims the benefit of priority from Japanese Patent Application No. 2021-153211, filed Sep. 21, 2021, the entire contents of which are incorporated herein by reference.

FIELD

Embodiments described herein relate generally to a sample stand and a method for manufacturing the sample stand.

BACKGROUND

As a method for observing a sample, observation with an analyzer such as a transmission electron microscope (hereinafter, referred to as TEM) or a scanning electron microscope (SEM) is known. As a method for preparing a sample for TEM observation, for example, a focused ion beam (hereinafter, referred to as FIB) can be used. In order to perform TEM observation of a sample, it is necessary to fix the sample on a sample stand called a mesh, thin the sample with an FIB or the like, and transfer the thinned sample from the FIB device to the TEM.

DESCRIPTION OF THE DRAWINGS

FIG. 5 is a flowchart illustrating a method for processing a sample in a processing device that uses the sample stand according to the first embodiment.

FIG. 7 is a flowchart illustrating a method for manufacturing the sample stand according to the first embodiment.

FIGS. 9A to 9C are views illustrating a sample stand of a comparative example.

FIG. 10 is a view illustrating a flow of analyzing a sample using the sample stand of the comparative example.

DETAILED DESCRIPTION

Figure 1:
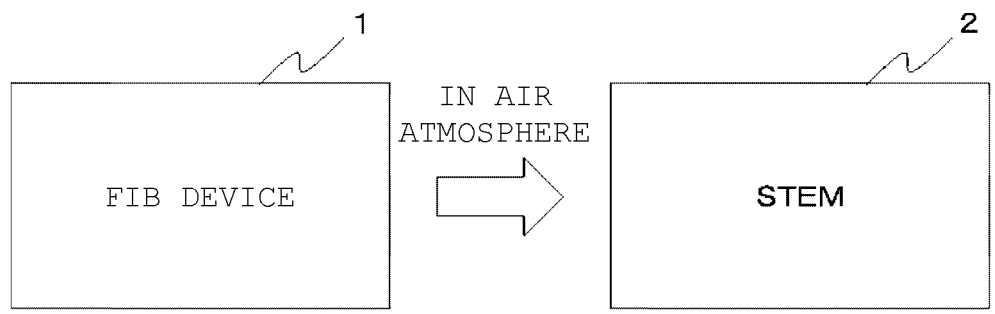
FIG. 1 is a view illustrating a flow of analyzing a sample using a sample stand according to a first embodiment.

Embodiments provide a sample stand for reducing the deterioration of a sample when the sample is transferred between devices.

In general, according to one embodiment, a sample stand includes a base portion that is made of a first material and has an arcuate outer edge in a plane having a first direction and a second direction orthogonal to the first direction, a first portion that is provided on an upper portion of the base portion in the second direction and in which a second material, different from the first material, is embedded, a second portion that is provided on the upper portion of the base portion in the second direction and in which a third material, different from the first material, is embedded, a sample holding portion on which a sample is to be held. The sample holding portion is provided on the upper portion of the base portion in the second direction, between the first portion and the second portion in a third direction orthogonal to each of the first direction and the second direction.

Hereinafter, embodiments will be described with reference to the drawings. The drawings are schematic, and the relationship between the thickness and the plane dimensions, the ratio of the thickness of each layer, and the like may differ from actual ones. Further, in the embodiments, elements that are substantially the same are designated by the same reference numerals, and the description thereof will not be repeated.

First Embodiment

A sample stand according to a first embodiment will be described with reference to FIGS. 1 to 8D.

Configuration

FIG. 1 is a view illustrating a flow of analyzing a sample using the sample stand according to the first embodiment. When observing a sample using an analyzer such as TEM, it is necessary to first thin the sample. In the present embodiment, for example, a scanning transmission electron microscope (STEM) 2 which is a kind of TEM is used as an analyzer, and an FIB device 1 is used as a processing device for thinning a sample.

As illustrated in FIG. 1, first, a sample S (not illustrated) is thinned using the FIB device 1 to have a thickness that allows an electron beam EB to transmit therethrough. The sample S is thinned by the FIB device 1 and then observed in the STEM 2. The sample S is transferred from the FIB device 1 to the STEM 2 in an air atmosphere, for example.

Figure 2:
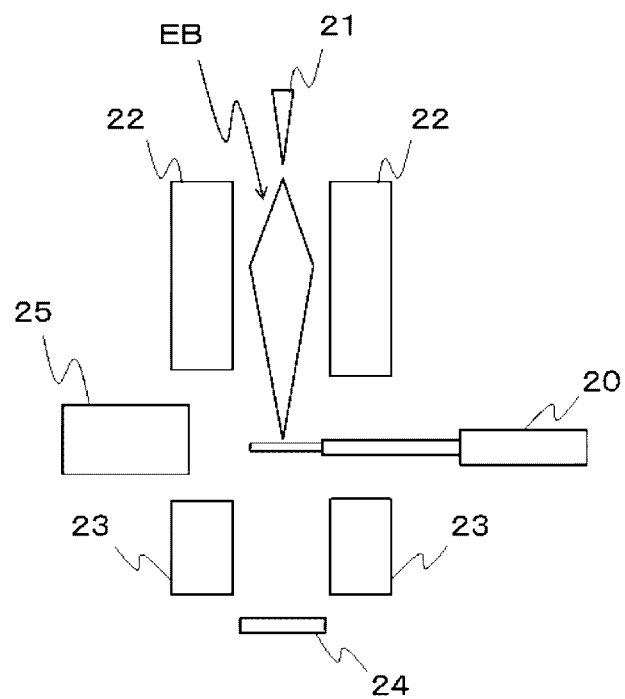
FIG. 2 is a view illustrating a configuration of an analyzer that uses the sample stand according to the first embodiment.

FIG. 2 is a view illustrating a configuration of an analyzer using the sample stand according to the first embodiment. As illustrated in FIG. 2, the STEM 2 includes a sample holder 20, an electron beam source 21, a focusing lens 22, an intermediate/projection lens 23, an electron beam detector 24, and a characteristic X-ray detector 25.

The sample holder 20 holds the sample S. In the present embodiment, the sample S is, for example, semiconductor device. The sample S is not limited to the semiconductor device, and may be a bulk material such as a metal. The sample S is thinned to have a thickness that allows the electron beam EB to transmit therethrough, for example, by using mechanical polishing, ion milling, FIB, or the like. In the present embodiment, the sample S is held in the sample holder 20 via a sample stand called a mesh, which will be described later.

The electron beam source 21 irradiates the sample S held by the sample holder 20 with the electron beam EB.

The focusing lens (e.g., a condenser-lens) 22 is provided between the electron beam source 21 and the sample holder 20, and can focus the electron beam EB irradiated toward the sample S.

The intermediate/projection lens 23 is provided between the sample holder 20 and the electron beam detector 24, and can magnify the electron beam EB transmitted or scattered through the sample S. By magnifying the electron beam EB with the intermediate/projection lens 23, the electron beam detector 24 can select and capture electrons having any scattering angle.

The electron beam detector 24 can capture and detect the electron beam EB transmitted or scattered through the sample S and magnified by the intermediate/projection lens 23. Image information of the sample S can be obtained by detecting the transmitted or scattered electron beam EB.

The characteristic X-ray detector 25 is disposed near the sample holder 20 and can detect the characteristic X-rays emitted by the electron beam EB irradiated to the sample S. By detecting the emitted characteristic X-rays, the types of elements and the quantity thereof in the sample S can be determined.

The configuration of the STEM 2 is not limited to the above configuration. In addition to the above configuration, a secondary electron beam detector, an electron energy loss spectrometer, a cathode luminescence detector, a camera, and the like may be provided.

Figure 3:
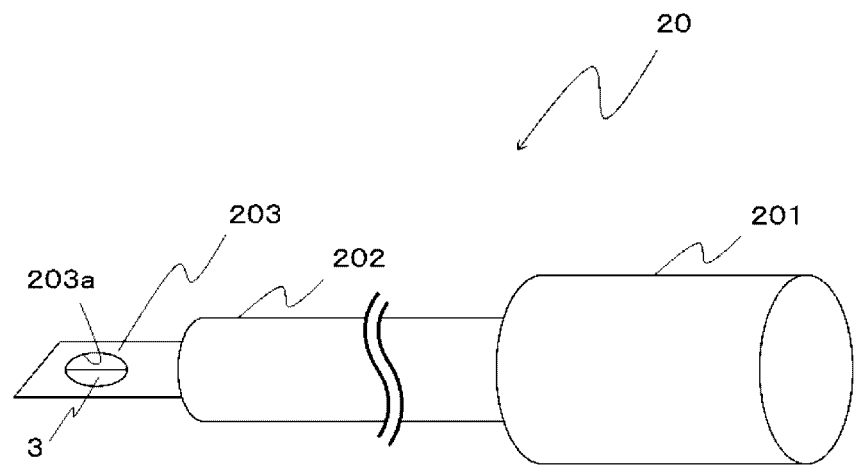
FIG. 3 is a view illustrating a configuration of a sample holder of the analyzer that uses the sample stand according to the first embodiment.

FIG. 3 is a view illustrating a configuration of a sample holder of an analyzer using the sample stand according to the first embodiment. As illustrated in FIG. 3, the sample holder 20 has a handle portion 201, a shaft portion 202, and a tip portion 203.

The handle portion 201 is a portion corresponding to the handle of the sample holder 20.

The shaft portion 202 is a portion that connects the handle portion 201 and the tip portion 203.

The tip portion 203 is a portion including a sample mounting portion 203a on which the sample stand (mesh) 3 for holding the sample S is mounted. The sample mounting portion 203a has, for example, a circular shape having an inner diameter of 3 mm.

Figure 4A:
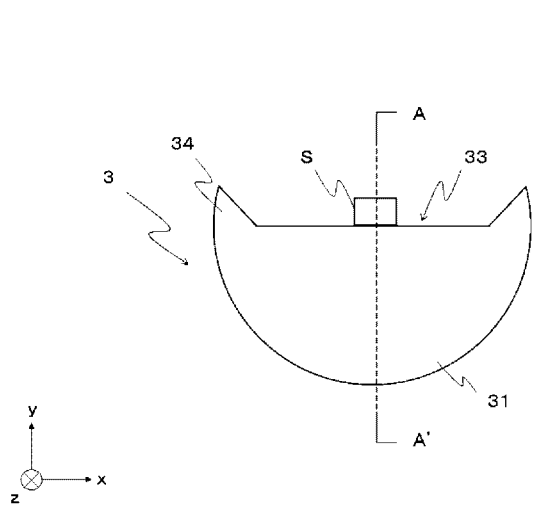
FIGS. 4A to 4C are views illustrating the sample stand according to the first embodiment.
Figure 4B:
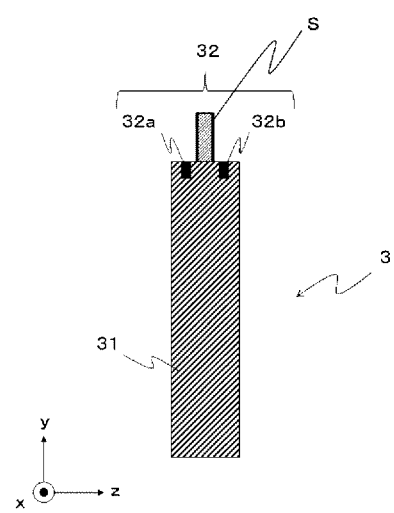
Figure 4C:
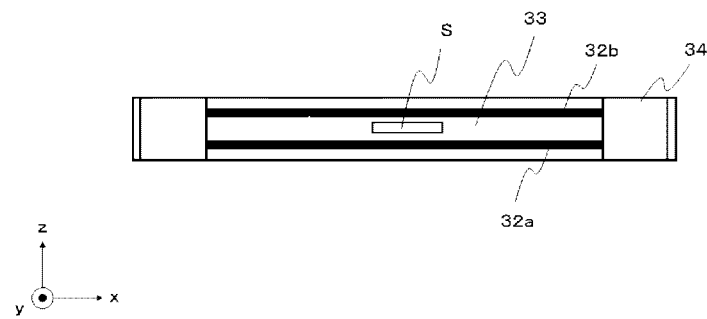

FIGS. 4A to 4C are views illustrating a sample stand according to the first embodiment. The first direction is the X direction depicted in the figures, the second direction, which is orthogonal to the first direction, the Y direction depicted in the figures, and the third direction, which is orthogonal to each of the first direction and the second direction, the Z direction depicted in the figures. FIG. 4A is a front view illustrating the XY plane. FIG. 4B is a cross-section taken along line A-A' of FIG. 4A. FIG. 4C is a plan view illustrating the XZ plane. As illustrated in FIGS. 4A to 4C, a sample stand 3 includes a base portion 31, an embedded portion 32, a sample holding portion 33, and a knob portion 34.

The base portion 31 is the base of the sample stand 3. The base portion 31 has a circular or arcuate outer edge in the XY plane. In the present embodiment, as illustrated in FIG. 4A, the base portion 31 is semi-circular and the outer edge is arcuate. The base portion 31 also has a diameter in the X direction. The arcuate outer edge of the base portion 31 corresponds to the circular inner edge of the sample mounting portion 203a of the sample holder 20. Specifically, for example, the base portion 31 has an arcuate outer edge having a diameter of 3 mm. The base portion 31 contains a first material, which is, for example, a metal. Examples of metals used as the first material include copper, molybdenum, and tungsten. In the present embodiment, the first material will be described as molybdenum. A notch may be formed at the outer edge of the base portion 31, and the outer edge of the base portion 31 does not have to have a perfect arcuate shape. The outer edge of the sample stand 3 is not particularly limited as long as the sample stand 3 can be held by the inner edge of the sample mounting portion 203a of the sample holder 20.

The embedded portion 32 is provided on the upper portion of the base portion 31 in the Y direction. In the present embodiment, the embedded portion 32 is provided in the diameter portion (which is the upper surface portion depicted in FIG. 4A) of the base portion 31. As illustrated in FIG. 4B, the embedded portion 32 includes a first embedded portion 32a in which a second material is embedded and a second embedded portion 32b in which a third material is embedded. The second material and the third material are the coating materials of the sample S. The second material and the third material contain an element having a chemical element number smaller than that of the first material. Examples of materials used as the second material and the third material include carbon, titanium, and aluminum. Further, as the second material and the third material, a compound containing carbon, titanium, and aluminum may be used. In the present embodiment, it is described that both the second material and the third material are carbon, but the second material and the third material may be the same material or different materials.

The embedded portion 32 is a quadrangle in the ZY plane, e.g., a rectangle in the present embodiment. Further, the height of the upper end of the embedded portion 32 in the Y direction is equal to or less than the height of the upper end of the base portion 31 in the Y direction. The height of the upper end of the embedded portion 32 in the Y direction is preferably the same as the height of the upper end of the base portion 31 in the Y direction. Further, it is preferable that the shapes of the first embedded portion 32a and the second embedded portion 32b are the same.

The sample holding portion 33 is an area for holding the sample S. As illustrated in FIGS. 4A and 4C, the sample holding portion 33 is provided on the upper portion of the base portion 31 in the Y direction and provided between the first embedded portion 32a and the second embedded portion 32b in the Z direction. In the present embodiment, the embedded portion 32 is provided in the diameter portion of the base portion 31. Further, in the present embodiment, the distance from the first embedded portion 32a to the center of the base portion 31 and the distance from the second embedded portion 32b to the center of the base portion 31 are the same in the Z direction. Further, it is preferable that the sample S is located at a position overlapping the center of the sample holding portion 33 in the Z direction.

The knob portion 34 is an area that allows the sample stand 3 to be pinched with tweezers or the like when transferring the sample S from the FIB device 1 to the STEM 2. As illustrated in FIG. 4A, the knob portion 34 is provided on the base portion 31 and has a height in the Y direction higher than that of the sample holding portion 33. In the present embodiment, the knob portion 34 is located as an extension of the outer edge of the base portion 31, and corresponds to the circular shape of the sample mounting portion 203a. The shape of the knob portion 34 is not limited thereto as long as the knob portion 34 can allow the sample stand 3 to be pinched. Further, the sample stand 3 may have a structure that does not include the knob portion 34.

Method for Processing Sample

FIG. 5 is a flowchart illustrating a method for processing a sample in a processing device that uses a sample stand according to the first embodiment. FIGS. 6A to 6E are views illustrating a method for processing a sample in a processing device that uses the sample stand according to the first embodiment. A method for preparing the sample S observed by an analyzer such as the STEM 2 with the FIB device 1 will be described with reference to FIGS. 5 and 6.

A sample S" is set on the sample stand of the FIB device 1. By using FIB, a protective film for processing is formed at any portion on the sample S". Then, the outer periphery of the protective film at the observation target portion of the sample S" is grinded away by using the FIB. Subsequently, the sample stand is inclined and the bottom portion of the sample S" is cut by the FIB. With the above, the rough processing of the sample S" is completed (S101).

By using the probe provided with the FIB device 1, a sample S' including the observation target portion is extracted from the sample S" and picked up at the sample holding portion 33 of the sample stand 3 (S102). The extracted sample S' is adhered to the sample holding portion 33 of the sample stand 3, for example by deposition of metal between the sample S' and the sample holding portion 33.

Figure 6A:
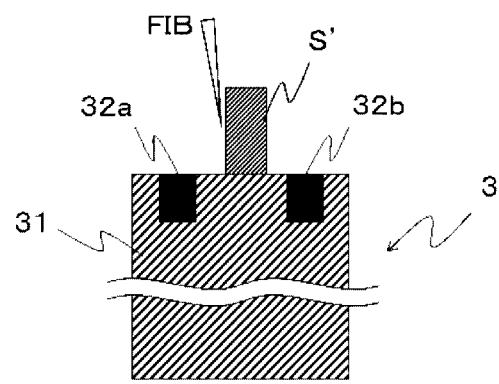
FIGS. 6A to 6E are views illustrating a method for processing the sample in the processing device that uses the sample stand according to the first embodiment.
Figure 6B:
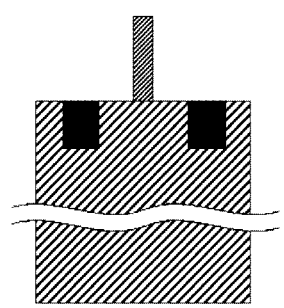

As illustrated in FIG. 6A, the sample S' is thinned by a FIB one side at a time so that the cross section of the observation target structure of the sample S' is exposed (S103). FIG. 6B illustrates the sample S' that has been thinned on both sides.

Figure 6C:
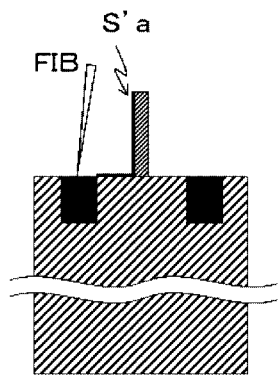

As illustrated in FIG. 6C, after the thinning is performed, the first embedded portion 32a is irradiated with the FIB while moving along the X direction, and one side S'a where the structure of the sample S' is exposed is coated with carbon, which is the second material (S104).

Figure 6D:
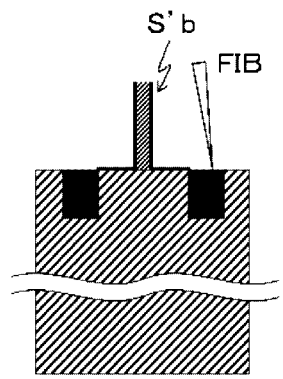
Figure 6E:
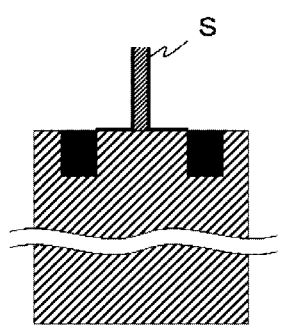

Subsequently, as illustrated in FIG. 6D, the second embedded portion 32b is irradiated with the FIB while moving along the X direction with the FIB, and the other side S'b where the structure of the sample S' is exposed is coated with carbon, which is the third material (S105). As illustrated in FIG. 6E, the cross section of the observation target structure of the sample S' is coated with carbon to complete the preparation of the sample S used for the observation in the STEM 2. Since the cross section of the observation target structure is coated with carbon, the cross section does not come into contact with the atmosphere when the sample 2 is transferred to the STEM 2.

Method for Manufacturing

FIG. 7 is a flowchart illustrating a method for manufacturing a sample stand according to the first embodiment. FIGS. 8A to 8D are views illustrating a method for manufacturing the sample stand according to the first embodiment. A method for manufacturing the sample stand 3 will be described with reference to FIGS. 7 and 8.

Figure 8A:
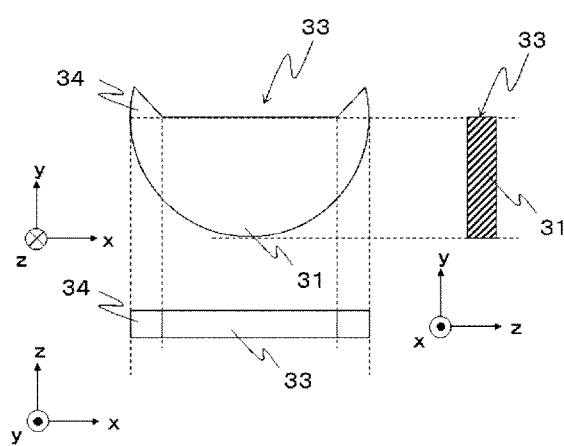
FIGS. 8A to 8D are views illustrating a method for manufacturing the sample stand according to the first embodiment.

First, as illustrated in FIG. 8A, molybdenum, which is the first material, is punched so as to have the shape of the sample stand 3 including the base portion 31 having an arcuate outer edge (S201). In this way, it is possible to form molybdenum into the shape of the sample stand 3. After punching, there may be a step of removing burrs that were formed on the base portion 31 by punching. Molybdenum, which is the first material, may be formed by metal etching so as to have the shape of the sample stand 3 including the base portion 31 having an arcuate outer edge.

Figure 8B:
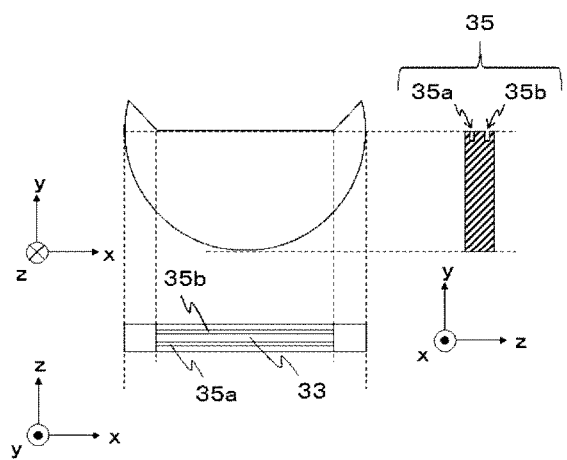

As illustrated in FIG. 8B, the punched cross section of the sample stand 3 is smoothed by a processing device such as a grinder. Then, a groove portion 35 is formed at the upper end of the base portion 31 in the Y direction (S202). The groove portion 35 includes a first groove portion 35a and a second groove portion 35b.

Figure 8C:
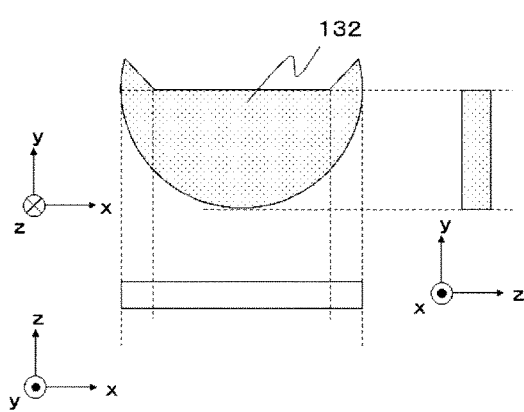

As illustrated in FIG. 8C, the entire sample stand 3 is embedded with a resin material 132 so that the resin material 132 containing carbon, which is the second material and the third material, is sufficiently immersed in the first groove portion 35a and the second groove portion 35b (S203). The resin material 132 is preferably of a phenol resin type.

Subsequently, the resin material 132 is cured (S204). After the resin material 132 is cured, unnecessary portions are removed by polishing.

Figure 8D:
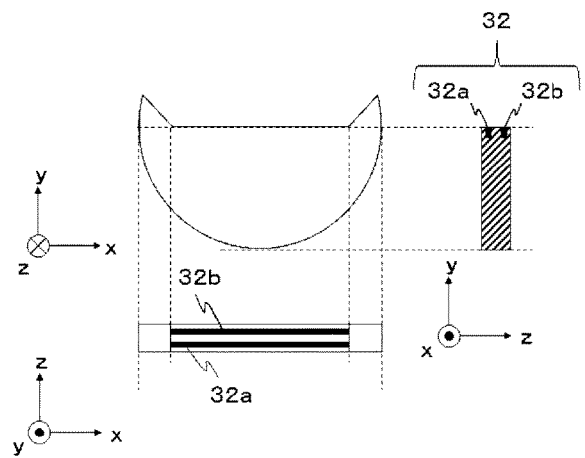

After removing unnecessary portions, the resin material 132 is sintered at a temperature equal to or lower than the melting point of the first material, and the resin material 132 embedded in the first groove portion 35a and the second groove portion 35b is carbonized (S205). It is possible to form glassy carbon by carbonizing the resin material 132. As a result, as illustrated in FIG. 8D, carbon is embedded in the first groove portion 35a and the second groove portion 35b to form the first embedded portion 32a and the second embedded portion 32b. Then, the surface of the sample stand 3 is processed by polishing, and the manufacturing of the sample stand 3 is completed.

Effect

Hereinafter, the effects of the present embodiment will be described with reference to the comparative example of FIGS. 9 and 10.

FIGS. 9A to 9C are views illustrating a sample stand of the comparative example. FIG. 9A is a front view illustrating the XY plane. FIG. 9B is a cross-section taken along line B-B' of FIG. 9A. FIG. 9C is a plan view illustrating the XZ plane.

As illustrated in FIGS. 9A to 9C, a sample stand 3' includes a base portion 31', a sample holding portion 33', and a knob portion 34'. The sample stand 3' does not have the embedded portion 32.

FIG. 10 is a view illustrating a comparative example of a flow of analyzing a sample using the sample stand of the comparative example.

In the comparative example, the sample S" is transferred from the FIB device 1 to the STEM 2 as the thinned sample S' in the FIB device 1. When the cross section of the observation target structure of the sample S' contains a material that easily oxidizes or a material that easily reacts with moisture, the transfer in an air atmosphere may deteriorate the sample S'. Therefore, it is desirable that the transfer from the FIB device 1 to the STEM 2 be performed without exposure to the atmosphere. An example of a material that is desirable to be transferred without exposure to the atmosphere is lithium, which is a battery material.

A holder for the FIB device 1 that is not exposed to atmosphere and a holder for the STEM 2 that is not exposed to atmosphere (both holders referred to herein as "air-free holder") may be provided for each device for the purpose of transferring without exposure to the atmosphere. When the FIB device 1 and STEM 2 are in a specific combination, it is possible to transfer the sample S' by using a shared air-free holder. However, the combination of the FIB device 1 and the STEM 2 that can use a shared air-free holder is limited.

When the sample S' is to be transferred without exposure to the atmosphere in a state where the FIB device 1 and the STEM 2 are not in the specific combination, a shared air-free holder cannot be used. Therefore, as illustrated in FIG. 10, in addition to the air-free holder for the FIB device 1 and the air-free holder for the STEM 2, it is necessary to prepare a transfer device 4 such as a glove box. Specifically, the sample stand 3' holding the sample S' held in the air-free holder for the FIB device 1 is replaced with the air-free holder for the STEM 2 in the glove box, and the sample S' is transferred from the FIB device 1 to the STEM 2 without exposure to the atmosphere.

According to the present embodiment, when the sample stand 3 is provided with the embedded portion 32, the cross section of the observation target structure of the sample S' thinned by the FIB device 1 can be coated. That is, it is possible to transfer the sample S' between the FIB device 1 and the STEM 2 while protecting the cross section of the observation target structure in the air atmosphere. Further, the FIB device 1 and the STEM 2 do not have to be a specific combination. Further, since the transfer device 4 is not necessary, existing devices can be used.

Second Embodiment

Next, a second embodiment will be described with reference to FIGS. 11A to 11C. The second embodiment differs from the first embodiment in that the embedded portion 32 is trapezoidal in the ZY plane. Since the configuration is the same as that of the sample stand of the first embodiment except that the embedded portion 32 is trapezoidal in the ZY plane, the same portions are designated by the same reference numerals and detailed description thereof will not be repeated.

Configuration

Figure 11A:
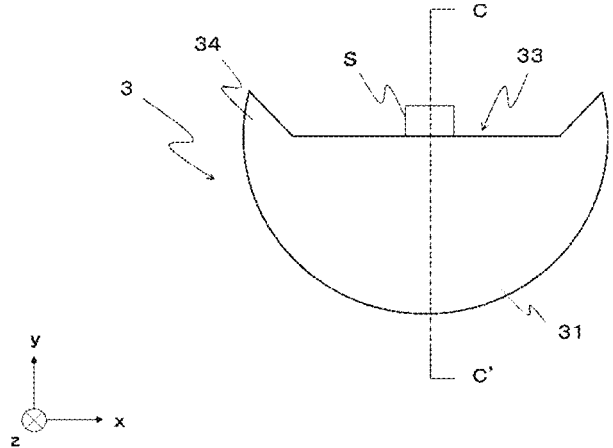
FIGS. 11A to 11C are views illustrating a sample stand according to a second embodiment.
Figure 11B:
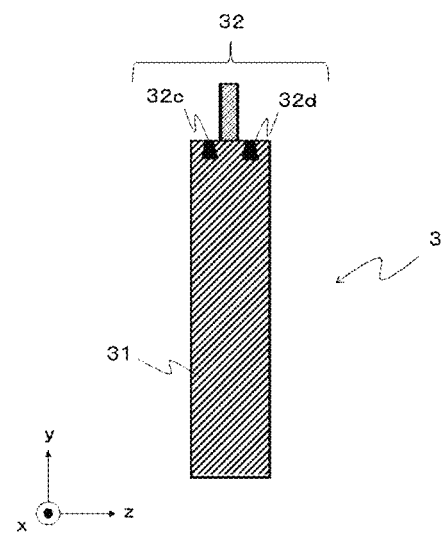
Figure 11C:
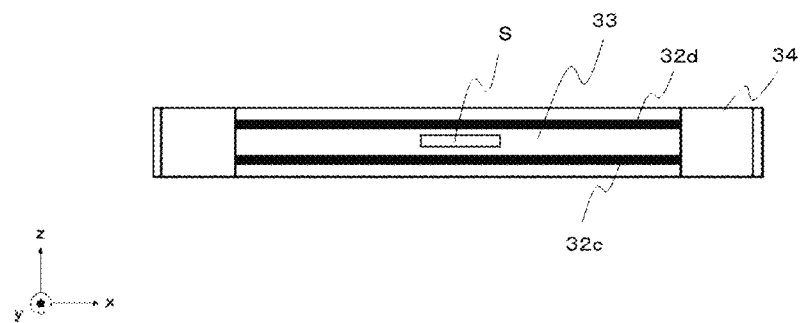

FIGS. 11A to 11C are views illustrating a sample stand according to the second embodiment. FIG. 11A is a front view illustrating the XY plane. FIG. 11B is a cross-section taken along line C-C' of FIG. 9A. FIG. 11C is a plan view illustrating the XZ plane. As illustrated in FIGS. 11A to 11C, the sample stand 3 includes the base portion 31, the embedded portion 32, the sample holding portion 33, and the knob portion 34.

As illustrated in FIG. 11B, the embedded portion 32 includes a third embedded portion 32c in which a fourth material is embedded and a fourth embedded portion 32d in which a fifth material is embedded. The fourth material and the fifth material are the coating materials of the sample S. The fourth material and the fifth material contain an element having a chemical element number smaller than that of the first material. The fourth material and the fifth material may be the same material or different materials. In the present embodiment, it is assumed that both the fourth material and the fifth material are carbon.

The embedded portion 32 is a quadrangle in the ZY plane, and in the present embodiment, is a trapezoid in which the width in the Z direction increases toward the lower end in the Y direction. Further, the height of the upper end of the embedded portion 32 in the Y direction is equal to or less than the height of the upper end of the base portion 31 in the Y direction. The height of the upper end of the embedded portion 32 in the Y direction is preferably the same as the height of the upper end of the base portion 31 in the Y direction. Further, it is preferable that the shapes of the third embedded portion 32c and the fourth embedded portion 32d are the same.

Effect

According to the present embodiment, the same effect as that of the first embodiment can be obtained. Further, in the present embodiment, the first material of the base portion 31 is a metal, and the fourth material and fifth material embedded in the embedded portion 32 are carbon which does not adhere well to the metal. In the present embodiment, since the shape of the ZY plane of the embedded portion 32 is a trapezoid in which the width in the Z direction becomes wider toward the lower end in the Y direction, as compared with the first embodiment, the width of the upper portion of the embedded portion 32 in the Y direction in the Z direction is narrower, and thus the embedded portion 32 is more likely not to be displaced from the groove portion 35. Therefore, the durability of the sample stand 3 is higher compared with the first embodiment.

Third Embodiment

Next, a third embodiment will be described with reference to FIGS. 12 and 13. The third embodiment differs from the first embodiment in that the base portion 31 has a convex shape in the ZY plane. Since the configuration is the same as that of the sample stand of the first embodiment except that the base portion 31 has a convex shape in the ZY plane, the same portions are designated by the same reference numerals and detailed description thereof will not be repeated.

Configuration

Figure 12A:
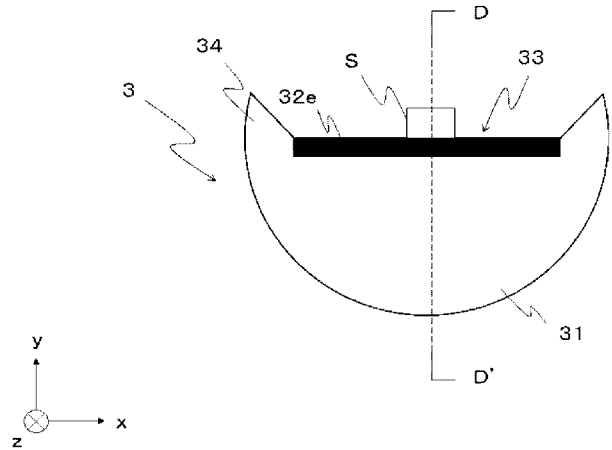
FIGS. 12A to 12C are views illustrating a sample stand according to a third embodiment.
Figure 12B:
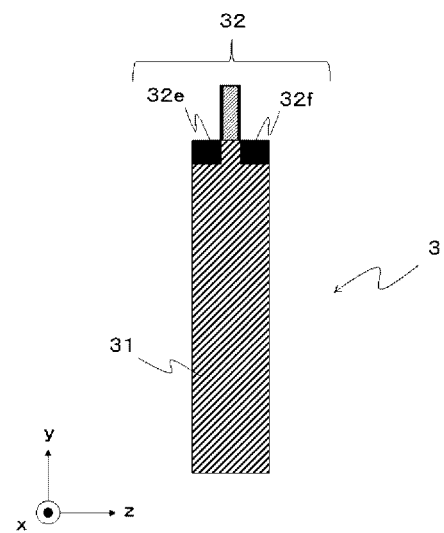
Figure 12C:
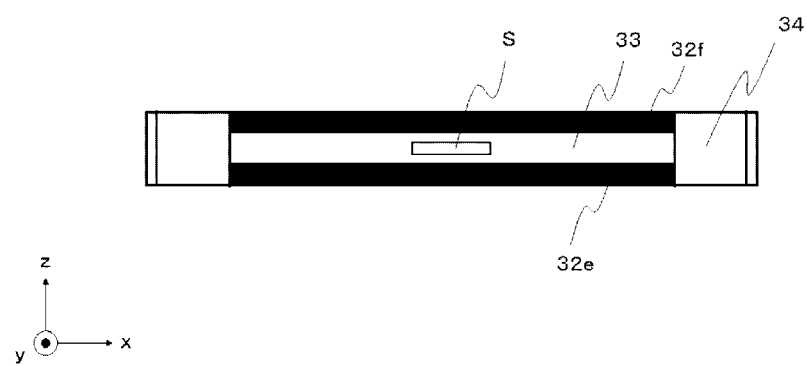

FIGS. 12A to 12C are views illustrating a sample stand according to the third embodiment. FIG. 12A is a front view illustrating the XY plane. FIG. 12B is a cross-section taken along line D-D' of FIG. 12A. FIG. 12C is a plan view illustrating the XZ plane. As illustrated in FIGS. 12A to 12C, the sample stand 3 includes the base portion 31, the embedded portion 32, the sample holding portion 33, and the knob portion 34.

As illustrated in FIG. 12B, the base portion 31 has a convex shape in the ZY plane.

As illustrated in FIG. 12B, the embedded portion 32 includes a fifth embedded portion 32e in which a sixth material is embedded and a sixth embedded portion 32f in which a seventh material is embedded. The sixth material and the seventh material are the coating materials of the sample S. The sixth material and the seventh material contain an element having a chemical element number smaller than that of the first material. The sixth material and the seventh material may be the same material or different materials.

The embedded portion 32 is a quadrangle in a plane having the Y direction and the Z direction. Further, the left end of the fifth embedded portion 32e in the Z direction extends as far as the left end of the base portion 31 in the Z direction. The right end of the sixth embedded portion 32f in the Z direction extends as far as the right end of the base portion 31 in the Z direction.

As illustrated in FIGS. 12A and 12C, the sample holding portion 33 is provided on the upper portion of the base portion 31 in the Y direction and provided between the fifth embedded portion 32e and the sixth embedded portion 32f in the Z direction. In the present embodiment, the embedded portion 32 is provided in the diameter portion of the base portion 31. Further, in the present embodiment, the distance from the fifth embedded portion 32e to the center of the base portion 31 and the distance from the sixth embedded portion 32f to the center of the base portion 31 are the same in the Z direction. Further, the sample S is preferably located at a position overlapping the center of the base portion 31 in the Z direction. Further, as illustrated in FIG. 12B, the width of the sample holding portion 33 in the Z direction is equal to the distance from the right end of the fifth embedded portion 32e in the Z direction to the left end of the sixth embedded portion 32f in the Z direction.

Method for Manufacturing

FIGS. 13A to 13D are views illustrating a method for manufacturing a sample stand according to the third embodiment. The flowchart illustrating the method for manufacturing is the same as that in FIG. 7. The steps except for step S202 are the same as those of the first embodiment, and the description of the common steps will not be repeated here.

Figure 13A:
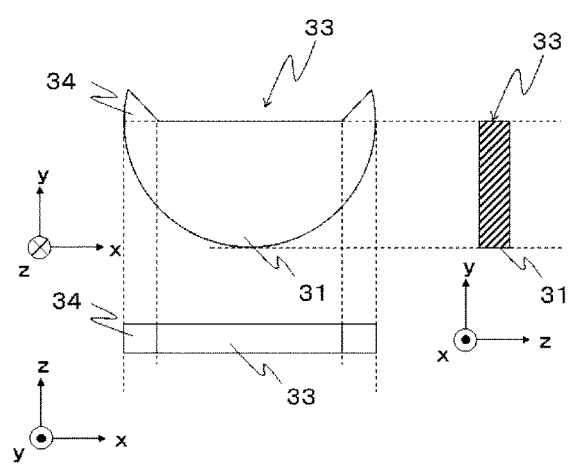
FIGS. 13A to 13D are views illustrating a method for manufacturing the sample stand according to the third embodiment.
Figure 13B:
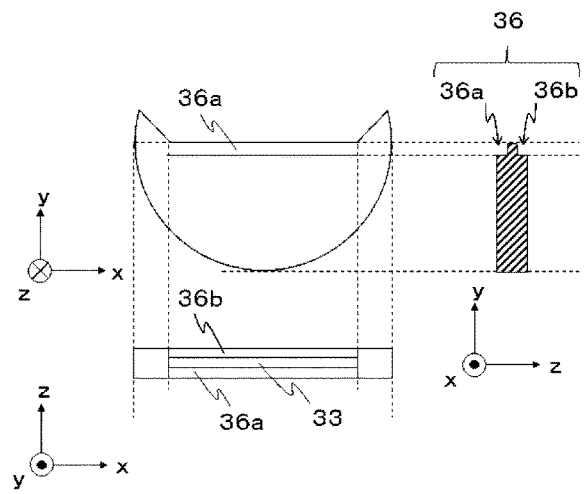
Figure 13C:
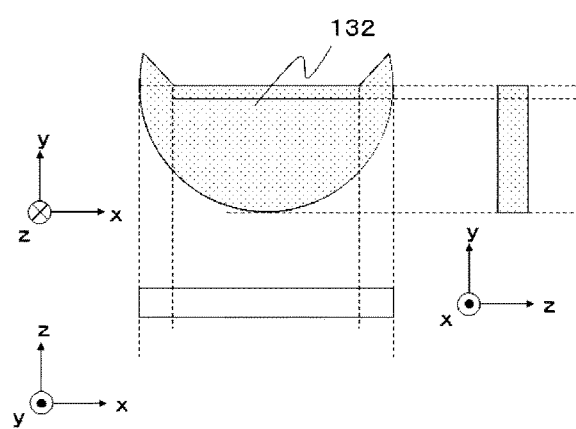
Figure 13D:
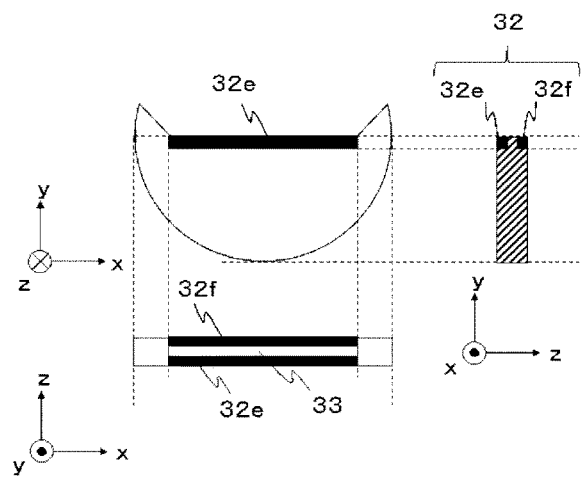

As illustrated in FIG. 13B, the punched cross section of the sample stand 3 is smoothed by a processing device such as a grinder. Then, a notch portion 36 is formed at the upper end of the base portion 31 in the Y direction (S202). The notch portion 36 includes a first notch portion 36a and a second notch portion 36b. Thereafter, the steps after step S203 are carried out, and the manufacturing of the sample stand 3 is completed.

Effect

According to the present embodiment, the same effect as that of the first embodiment can be obtained. Further, in the present embodiment, by forming the base portion 31 into a convex shape, the embedded portion 32 can be formed by using the notch portion 36 which is easy to process instead of the groove portion 35, and the manufacturing becomes easy.

Fourth Embodiment

Next, a fourth embodiment will be described with reference to FIGS. 14 to 16. The fourth embodiment differs from the first embodiment in that an inclined portion 37 that sandwiches the sample holding portion 33 is provided. Since the configuration is the same as that of the sample stand of the first embodiment except that the inclined portion 37 that sandwiches the sample holding portion 33 is provided, the same portions are designated by the same reference numerals and detailed description thereof will not be repeated.

Configuration

Figure 14A:
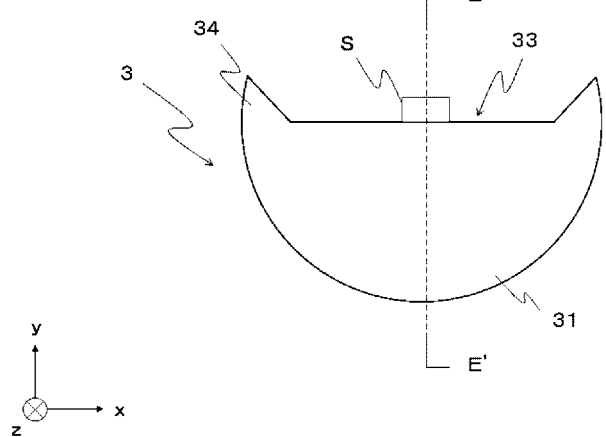
FIGS. 14A to 14C are views illustrating a sample stand according to a fourth embodiment.
Figure 14B:
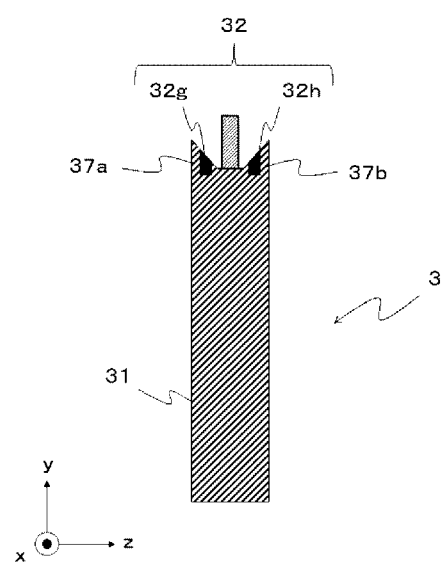
Figure 14C:
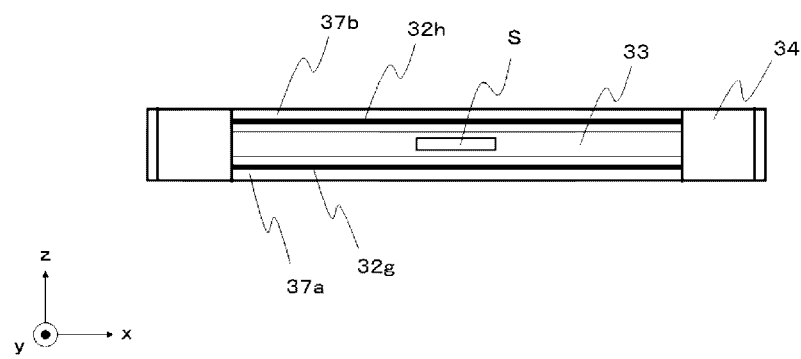

FIGS. 14A to 14C are views illustrating a sample stand according to the fourth embodiment. FIG. 14A is a front view illustrating the XY plane. FIG. 12B is a cross-section taken along line E-E' of FIG. 12A. FIG. 14C is a plan view illustrating the XZ plane. As illustrated in FIGS. 14A to 14C, the sample stand 3 includes the base portion 31, the embedded portion 32, the sample holding portion 33, and the knob portion 34.

As illustrated in FIGS. 14B and 14C, the base portion 31 includes the inclined portion 37 that sandwiches the sample holding portion 33. The inclined portion 37 includes a first inclined portion 37a and a second inclined portion 37b.

The embedded portion 32 is provided on the upper portion of the base portion 31 in the Y direction and on the inclined portion 37. As illustrated in FIG. 14B, the embedded portion 32 includes a seventh embedded portion 32g in which the sixth material is embedded and an eighth embedded portion 32h in which the seventh material is embedded. The seventh embedded portion 32g is provided on the first inclined portion 37a, and the eighth embedded portion 32h is provided on the second inclined portion 37b. The sixth material and the seventh material are the coating materials of the sample S. The sixth material and the seventh material contain an element having a chemical element number smaller than that of the first material. The sixth material and the seventh material may be the same material or different materials.

The embedded portion 32 is trapezoidal in the ZY plane. Further, the embedded portion 32 does not protrude from the inclination of the inclined portion 37. It is preferable that the surface of the embedded portion 32 has one inclination that is contiguous with the inclined portion 37. Further, it is preferable that the shapes of the seventh embedded portion 32g and the eighth embedded portion 32h are the same.

As illustrated in FIGS. 14B and 14C, the sample holding portion 33 is provided on the upper portion of the base portion 31 in the Y direction and provided between the first inclined portion 37a and the second inclined portion 37b in the Z direction. Further, in the present embodiment, the distance from the seventh embedded portion 32g to the center of the base portion 31 and the distance from the eighth embedded portion 32h to the center of the base portion 31 are the same in the Z direction. Further, the sample S is preferably located at a position overlapping the center of the base portion 31 in the Z direction.

Method for Manufacturing

Figure 15:
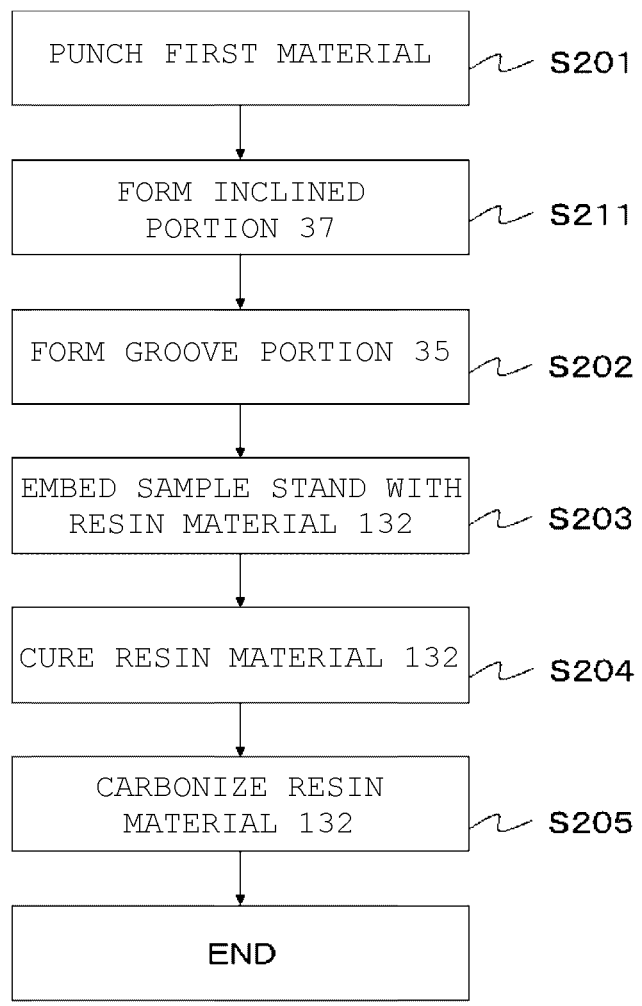
FIG. 15 is a flowchart illustrating a method for manufacturing the sample stand according to the fourth embodiment.

FIG. 15 is a flowchart illustrating a method for manufacturing a sample stand according to the fourth embodiment. FIGS. 16A to 16E are views illustrating a method for manufacturing a sample stand according to the fourth embodiment. A method for manufacturing the sample stand 3 will be described with reference to FIGS. 15 and 16. The steps except for steps S211 and S202 are the same as those in the first embodiment, and the description of the common steps will not be repeated herein.

Figure 16A:
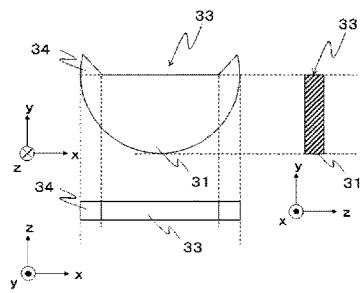
FIGS. 16A to 16E are views illustrating a method for manufacturing the sample stand according to the fourth embodiment.
Figure 16B:
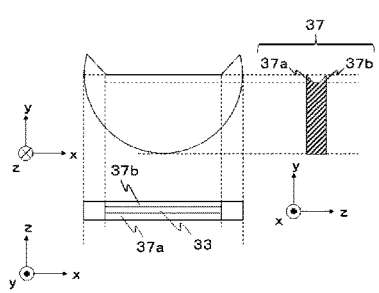

After punching the first material in step S201, as illustrated in FIG. 16B, the punched cross section of the sample stand 3 is smoothed by a processing device such as a grinder. Then, the upper end of the base portion 31 in the Y direction is obliquely scraped so that the flat portion to be the sample holding portion 33 remains, and the inclined portion 37 is formed (S211).

Figure 16C:
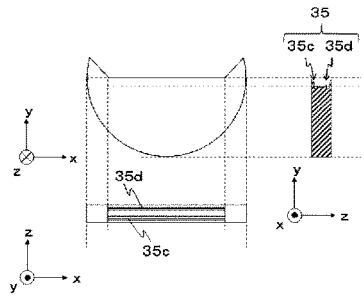
Figure 16D:
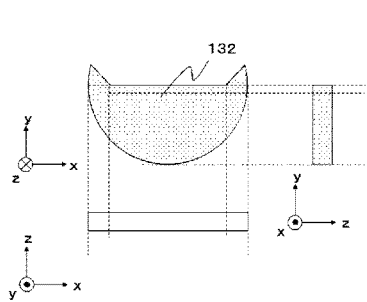
Figure 16E:
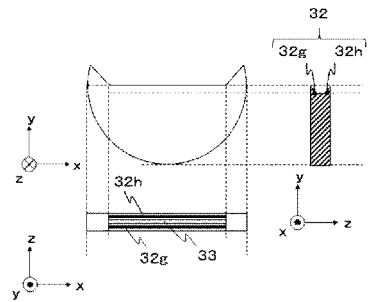

As illustrated in FIG. 16C, the groove portion 35 is formed in the inclined portion 37 (S202). Specifically, a third groove portion 35c is formed in the first inclined portion 37a, and a fourth groove portion 35d is formed in the second inclined portion 37b. Since the subsequent process is the same as that of the first embodiment, the description thereof will be omitted.

Effect

According to the present embodiment, the same effect as that of the first embodiment can be obtained. Further, as compared with the first embodiment, since the inclined portion 37 is provided, the cross section of the observation target structure of the sample S' is closer to the embedded portion 32. Therefore, it is possible to sufficiently coat the cross section of the observation target structure of the sample S' as compared with the first embodiment.

Fifth Embodiment

Next, a fifth embodiment will be described. The fifth embodiment differs from the first embodiment in that the base portion 31 includes a bottom surface 38. Since the configuration is the same as that of the sample stand of the first embodiment except that the base portion 31 includes the bottom surface 38, the same portions are designated by the same reference numerals and detailed description thereof will not be repeated.

Configuration

Figure 17:
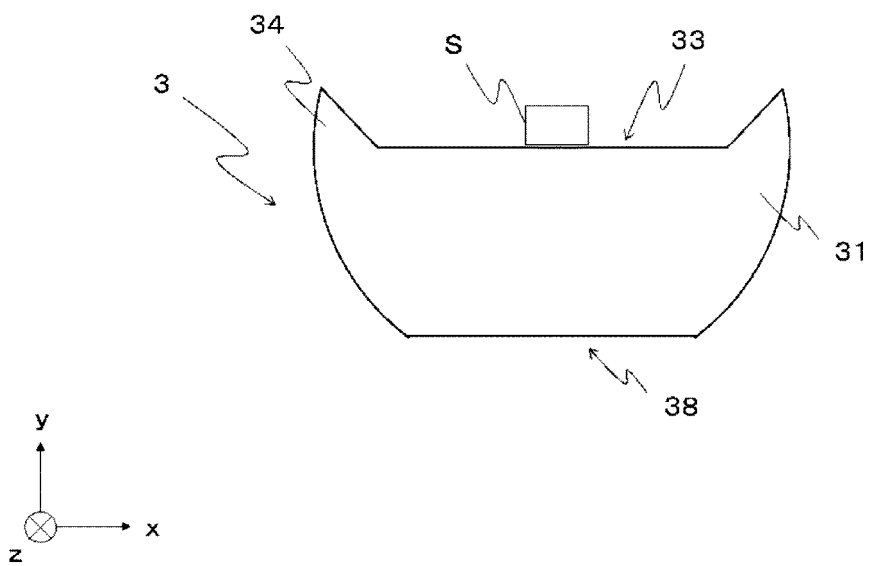
FIG. 17 is a view illustrating a sample stand according to a fifth embodiment.

FIG. 17 is a view illustrating a sample stand according to the fifth embodiment. The sample stand 3 includes the base portion 31, the embedded portion 32 (not illustrated), the sample holding portion 33, and the knob portion 34.

As illustrated in FIG. 17, the base portion 31 includes the bottom surface 38 having a circular or arcuate outer edge in the XY plane and a linear lower end in the Y direction. In the present embodiment, the base portion 31 is semi-circular and the outer edge is arcuate. Further, the base portion 31 has a diameter in the X direction, and the bottom surface 38 is parallel to the diameter.

Effect

The same effect as that of the first embodiment can be obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A sample stand comprising:
   a base portion that is made of a first material and has an arcuate outer edge in a plane having a first direction and a second direction orthogonal to the first direction;
   a first portion that is provided on an upper portion of the base portion in the second direction and in which a second material, different from the first material, is embedded;
   a second portion that is provided on the upper portion of the base portion in the second direction and in which a third material, different from the first material, is embedded; and
   a sample holding portion on which a sample is to be held, wherein the sample holding portion is provided on the upper portion of the base portion in the second direction, between the first portion and the second portion in a third direction orthogonal to each of the first direction and the second direction.

2. The sample stand according to claim 1, wherein the outer edge of the base portion has a shape that corresponds to a shape of an inner edge of a sample mounting portion of an analyzer on which the sample stand is mounted.

3. The sample stand according to claim 1, wherein the sample holding portion is located at a position overlapping a center of the base portion in the third direction.

4. The sample stand according to claim 3, wherein a distance from the first portion to the center of the base portion in the third direction and a distance from the second portion to the center of the base portion in the third direction are the same.

5. The sample stand according to claim 1, wherein the first and second portions each have a shape of a quadrangle in a plane having the second direction and the third direction.

6. The sample stand according to claim 5, wherein the first and second portions each have a rectangular shape in the plane having the second direction and the third direction.

7. The sample stand according to claim 5, wherein the first and second portions each have a trapezoidal shape in the plane having the second direction and the third direction.

8. The sample stand according to claim 1, wherein the base portion has a flat bottom surface in a plane that is perpendicular to the second direction.

9. The sample stand according to claim 1, further comprising:
   a knob portion that is provided on the base portion and has a height higher than that of the sample holding portion in the second direction.

10. The sample stand according to claim 1, wherein the first material is metal.

11. The sample stand according to claim 10, wherein the first material is one of copper, molybdenum, and tungsten.

12. The sample stand according to claim 1, wherein the second material and the third material contain an element having a chemical element number smaller than that of the first material.

13. The sample stand according to claim 12, wherein the second material and the third material contain one of carbon, titanium, and aluminum.

14. The sample stand according to claim 13, wherein the second material and the third material are the same.

15. The sample stand according to claim 1, wherein a height of an upper end of the first and second portions in the second direction is the same as or lower than a height of an upper end of the base portion in the second direction.

16. The sample stand according to claim 15, wherein the first and second portions extend in the first direction.

17. The sample stand according to claim 1, wherein the base portion has a diameter of 3 mm in the first direction.

18. A method for manufacturing a sample stand, the method comprising:
    punching a first material to produce a base portion having an arcuate outer edge in a plane having a first direction and a second direction orthogonal to the first direction;
    forming a first groove portion and a second groove portion at an upper end of the base portion in the second direction;
    embedding a resin material containing an element having a chemical element number smaller than that of the first material in the first groove portion and the second groove portion and curing the resin material; and
    carbonizing the resin material embedded in the first groove portion and the second groove portion.

19. The method according to claim 18, wherein the first groove portion and the second groove portion extend in the first direction.

20. The method according to claim 19, wherein the first groove portion and the second groove portion are equidistant from a center line of an upper surface of the base portion, that extends in the first direction.

* * * * *